United States Patent
Liu et al.

(10) Patent No.: US 9,270,050 B2
(45) Date of Patent: Feb. 23, 2016

(54) PROTECTIVE COVER MECHANISM FOR PROTECTING A SOCKET OF AN ELECTRONIC DEVICE AND ELECTRONIC DEVICE THEREWITH

(71) Applicant: Wistron Corporation, New Taipei (TW)

(72) Inventors: Sheng-Fu Liu, New Taipei (TW); Yao-De Huang, New Taipei (TW); Jeng-Ming Lai, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/074,728

(22) Filed: Nov. 8, 2013

(65) Prior Publication Data

US 2014/0179134 A1  Jun. 26, 2014

(30) Foreign Application Priority Data

Dec. 25, 2012 (TW) ............... 101149748 A (51) Int. Cl.
  *H01R 13/52* (2006.01)
  *H05K 7/20* (2006.01)
  *G06F 1/18* (2006.01)

(52) U.S. Cl.
  CPC .............. *H01R 13/5213* (2013.01); *G06F 1/18* (2013.01); *H05K 7/20145* (2013.01)

(58) Field of Classification Search
  CPC ......... H01R 13/5213; H05K 7/20; F28F 3/02; G02F 2201/36; H01L 23/457; G06F 1/20–1/203; G06F 2200/201
  USPC ............. 439/485–487, 135, 331, 940, 41, 73, 439/326, 342; 228/49.5; 361/679.49, 361/679.51
  See application file for complete search history.

(56) References Cited

U.S. PATENT DOCUMENTS

| | | | | |
|---|---|---|---|---|
| 7,083,456 B2* | 8/2006 | Trout et al. | ................... | 439/326 |
| 7,140,890 B1* | 11/2006 | Ju | ....................... | H01R 43/205 |
| | | | | 439/135 |
| 7,517,229 B2* | 4/2009 | Ma | ................................. | 439/73 |
| 7,566,225 B1* | 7/2009 | Ho | ..................... | H01R 13/447 |
| | | | | 439/41 |
| 7,575,449 B1* | 8/2009 | Cai | ..................... | H05K 7/1053 |
| | | | | 439/135 |
| 7,753,687 B2* | 7/2010 | Fan | ................................ | 439/41 |

(Continued)

FOREIGN PATENT DOCUMENTS

| CN | 101835361 A | 9/2010 |
|---|---|---|
| CN | 202275968 U | 6/2012 |

(Continued)

OTHER PUBLICATIONS

Office action mailed on Dec. 5, 2014 for the Taiwan application No. 101149748, filing date: Dec. 25, 2012, p. 1 line 12~14, p. 2~8 and p. 9 line 1~3.

(Continued)

*Primary Examiner* — Amy Cohen Johnson
*Assistant Examiner* — Matthew T Dzierzynski
(74) *Attorney, Agent, or Firm* — Winston Hsu; Scott Margo (57) ABSTRACT

The present invention discloses a protective cover mechanism for protecting a socket of an electronic device. The protective cover mechanism includes a base and a fluid restrictor. The base is disposed on the socket for covering the socket. The fluid restrictor is installed on the base and is for blocking airflow on a side of the socket, so as to guide the airflow to a neighboring electronic component.

18 Claims, 10 Drawing Sheets

(56) References Cited

U.S. PATENT DOCUMENTS

| | | | |
|---|---|---|---|
| 8,120,907 B2 * | 2/2012 | Chen | H01L 23/467 361/690 |
| 8,439,693 B2 * | 5/2013 | Yeh et al. | 439/135 |
| 8,622,278 B1 * | 1/2014 | Alvarez et al. | 228/49.5 |
| 8,939,776 B2 * | 1/2015 | Liang et al. | 439/78 |
| 2006/0116015 A1 * | 6/2006 | Ju | H05K 7/1053 439/331 |
| 2007/0235168 A1 * | 10/2007 | Chen | G06F 1/20 165/124 |
| 2008/0102665 A1 * | 5/2008 | Fan | H01R 13/447 439/135 |
| 2014/0199860 A1 * | 7/2014 | Liang | H05K 7/10 439/78 |
| 2015/0055296 A1 * | 2/2015 | Joko | H05K 7/20145 361/695 |

FOREIGN PATENT DOCUMENTS

| | | |
|---|---|---|
| TW | M352161 | 3/2009 |
| TW | I372595 | 9/2012 |

OTHER PUBLICATIONS

Office action mailed on Jul. 31, 2015 for the China application No. 201310010873.6, p. 3 line 5~25 and line 27~31, p. 4 line 1~2, line 4~12, line 14~17, line 19~24 and line 26~30, p. 5 line 1~2, line 4~11, line 13~19, line 21~23 and line 25~30, p. 6 line 1~22 and line 24~30, p. 7 line 2~10, line 12~15, line 17~22 and line 24~30 and p. 8 line 2~9, line 11~17 and line 19~26.

* cited by examiner

PROTECTIVE COVER MECHANISM FOR PROTECTING A SOCKET OF AN ELECTRONIC DEVICE AND ELECTRONIC DEVICE THEREWITH

BACKGROUND OF THE INVENTION

1. Field of the Invention

The present invention relates to a protective cover mechanism, and more specifically, to a protective cover mechanism for protecting a socket of an electronic device.

2. Description of the Prior Art

Motherboards of electronic devices are often stacked in a delivery vehicle as being transported to the factory for assembly, so that a socket, like a CPU socket, is damaged easily because of collision between the motherboards. As a result, it is usually to dispose a protective cover on the CPU socket for preventing the CPU socket from being damaged due to the collision in transportation. However, the conventional protective cover is too thin and has no specific shape for identification, so that it does not facilitate an operator to take, to position and to assemble, resulting in wasting a lot of assembly time and labor. As a result, it is an important issue to design a protective cover mechanism for protecting the CPU socket with easy assembly.

SUMMARY OF THE INVENTION

The present invention is to provide a protective cover mechanism for protecting a socket of an electronic device to solve above problems.

According to the disclosure, a protective cover mechanism includes a base and a fluid restrictor. The base is disposed on a socket for covering the socket. The fluid restrictor is installed on the base for blocking airflow on a side of the socket, so as to guide the airflow to a neighboring electronic component.

According to the disclosure, the fluid restrictor comprises a protruding column, and an engaging slot is formed on the base for engaging with the protruding column, so that the fluid restrictor is pivoted to the base.

According to the disclosure, the protruding column is made of resilient material, and the protruding column is separated from the engaging slot as being pressed inward, so as to separate the fluid restrictor from the base.

According to the disclosure, the fluid restrictor does not block the airflow on the side of the socket as the fluid restrictor pivots to a position where the fluid restrictor is substantially parallel to the base.

According to the disclosure, a plurality of holes is formed on the fluid restrictor for controlling a flow rate of the airflow passing through the fluid restrictor.

According to the disclosure, the base is installed on the socket or on an independent loading mechanism in a detachable manner.

According to the disclosure, the base comprises at least one resilient fixing arm for engaging with the socket.

According to the disclosure, the at least one resilient fixing arm and the base are integrally formed.

According to the disclosure, the base comprises at least one resilient fixing arm for engaging with an independent loading mechanism.

According to the disclosure, the at least one resilient fixing arm and the base are integrally formed.

According to the disclosure, an electronic device includes a casing, a circuit board, an electronic component, a socket, an independent loading mechanism and a protective cover mechanism. The circuit board is disposed inside the casing. The electronic component is installed on the circuit board. The socket is installed on the circuit board. The independent loading mechanism is pivoted to the circuit board for engaging a chipset with the socket. The protective cover mechanism is for protecting the socket of the electronic device. The protective cover mechanism includes a base and a fluid restrictor. The base is disposed on the socket for covering the socket. The fluid restrictor is installed on the base for blocking airflow on a side of the socket, so as to guide the airflow to a neighboring electronic component.

The protective cover mechanism of the present invention is engaged with the base or the independent loading mechanism by the resilient fixing arm of the base, and the protective cover mechanism is for prevent the socket from being damaged due to the collision. The fluid restrictor is further disposed on the base of the protective cover mechanism, so as to guide the airflow passing by the socket to the neighbor electronic component by pivoting the fluid restrictor relative to the base, to dissipate the heat generated by the neighbor electronic component. Therefore, it can solve the problem of the socket being damaged due to the collision between the motherboards, and further provides an effect of guiding the airflow passing by the socket to the neighbor electronic component to dissipate the heat generated by the neighbor electronic component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
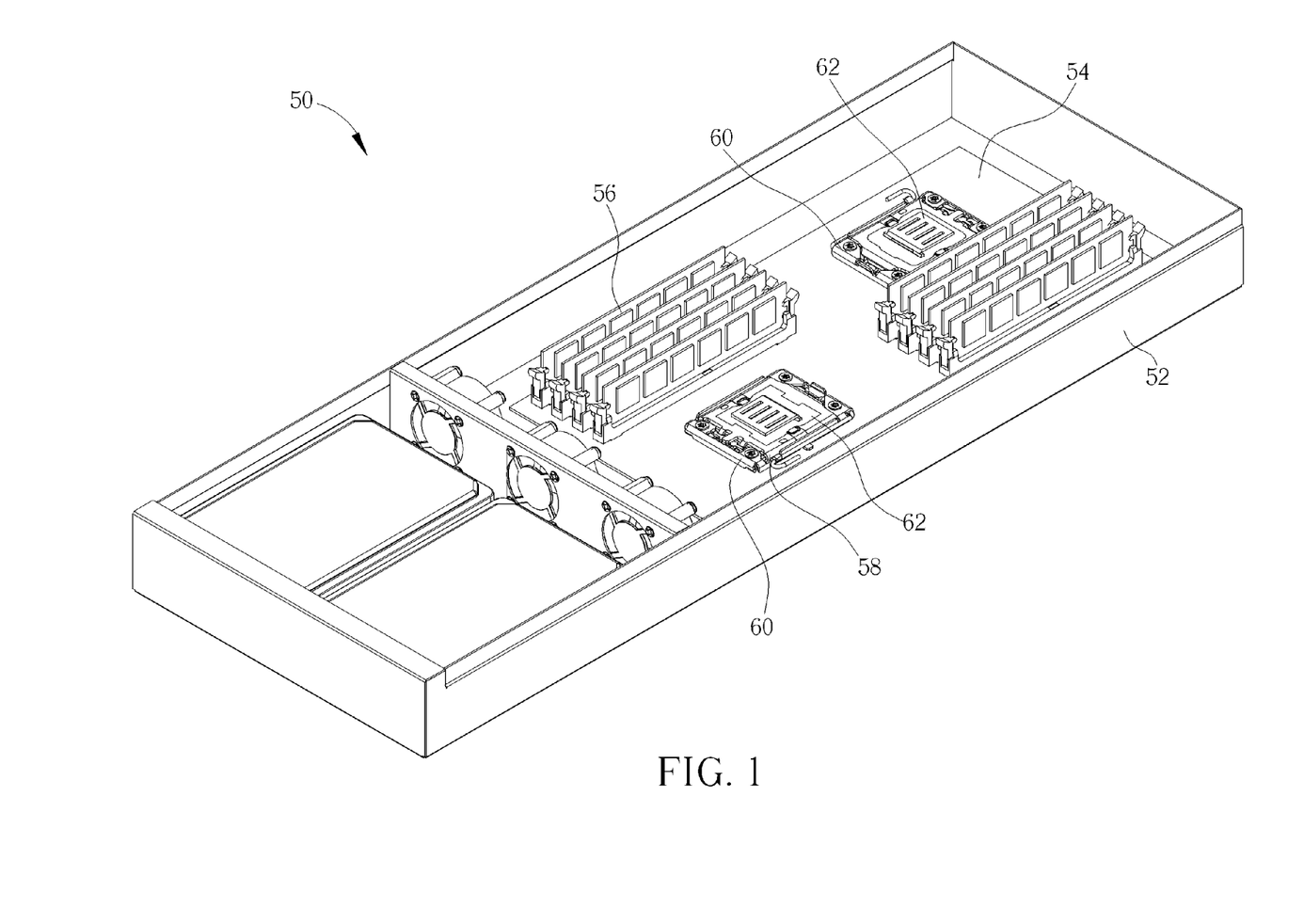
FIG. 1 is an internal structural diagram of an electronic device according to an embodiment of the present invention.

Please refer to FIG. 1. FIG. 1 is an internal structural diagram of an electronic device 50 according to an embodiment of the present invention. The electronic device 50 can be a desktop computer of a business server computer. The electronic device 50 includes a casing 52, a circuit board 54, at least one electronic component 56, a socket 58, an independent loading mechanism 60 (ILM) and a protective cover mechanism 62. The casing 52 is used for covering internal electronic components, such as a CPU, a hard drive, a fan, memories, expansion cards, and so on. The circuit board 54 is disposed inside the casing 52, and the circuit board 54 can be a motherboard. The electronic component 56 is installed on the circuit board 54, and the electronic component 56 can be the hard drive, the memory or the expansion card. In this embodiment, the electronic device 50 can include a plurality of electronic components 56. The socket 58 is installed on the circuit board 54, and the independent loading mechanism 60 is pivoted to the circuit board 54 for engaging a chipset with the socket 58. In this embodiment, the socket 58 can be a CPU socket for electrically connected to a CPU chipset, and the independent loading mechanism 60 is for engaging the CPU chipset with the socket 58.

Figure 2:
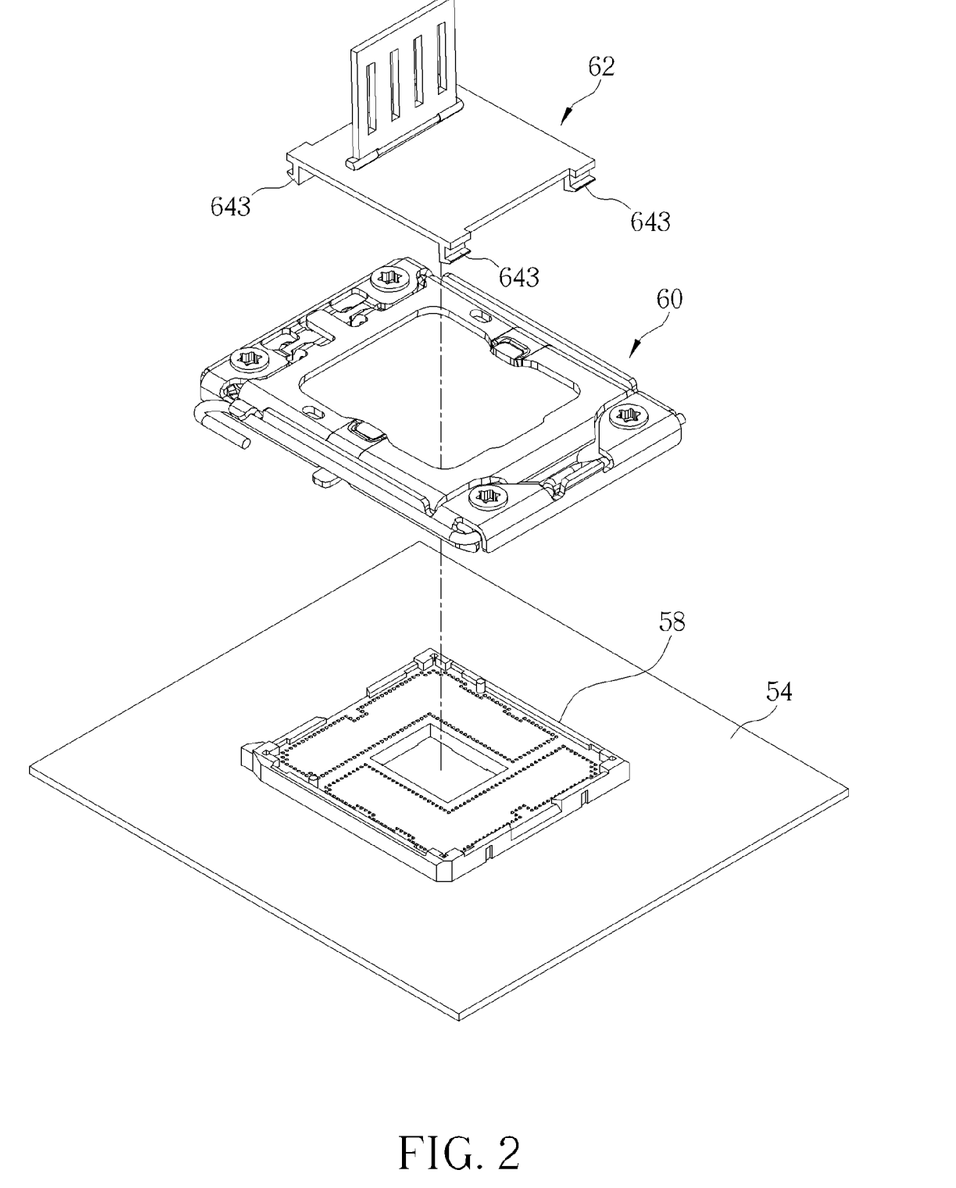
FIG. 2 is a partial exploded diagram of the electronic device illustrated in FIG. 1 according to the embodiment of the present invention.
Figure 3:
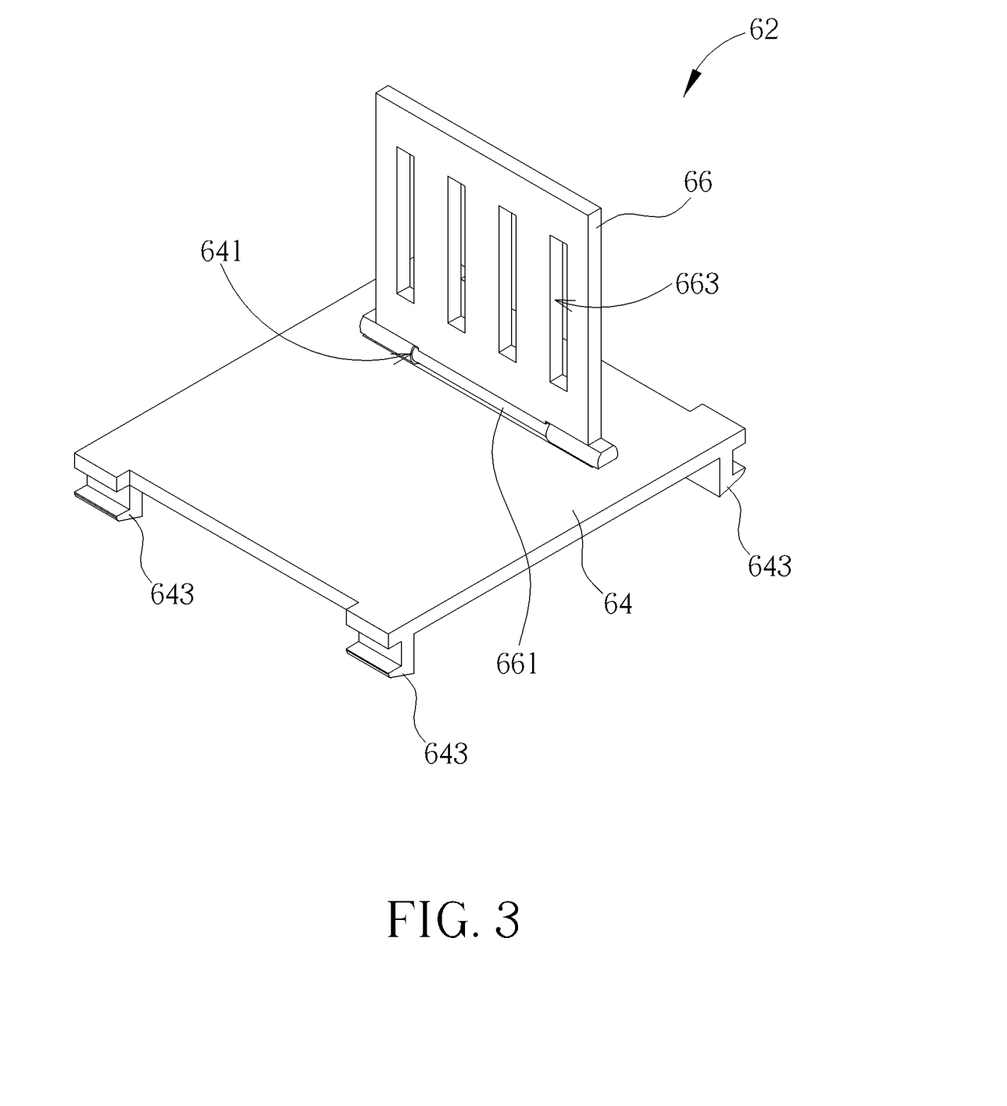
FIG. 3 is a diagram of a protective cover mechanism according to the embodiment of the present invention.
Figure 4:
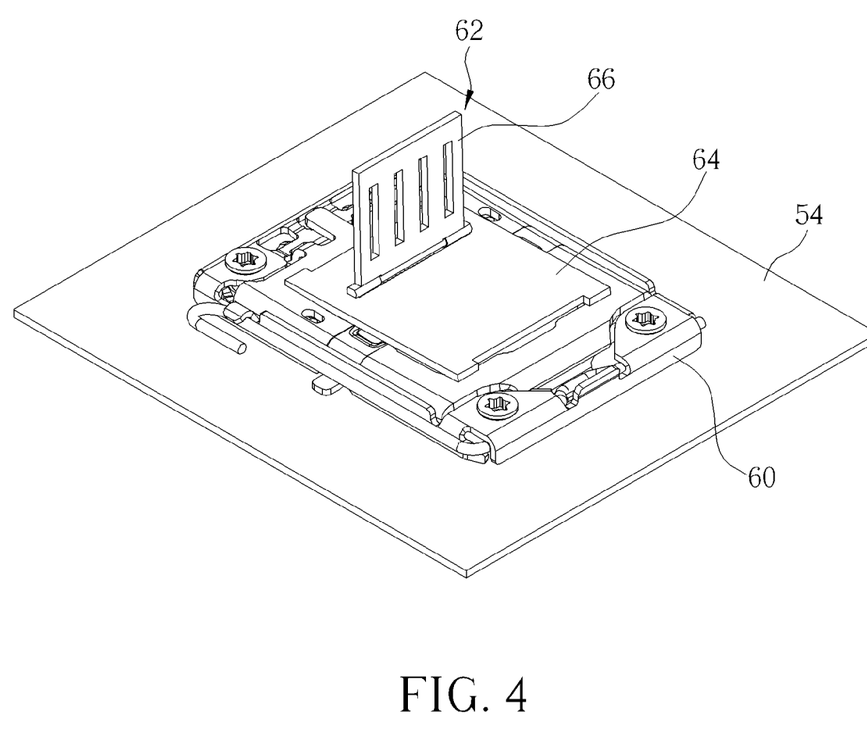
FIG. 4 and FIG. 5 are assembly diagrams of a socket covered with the protective cover mechanism in different states according to the embodiment of the present invention.
Figure 5:
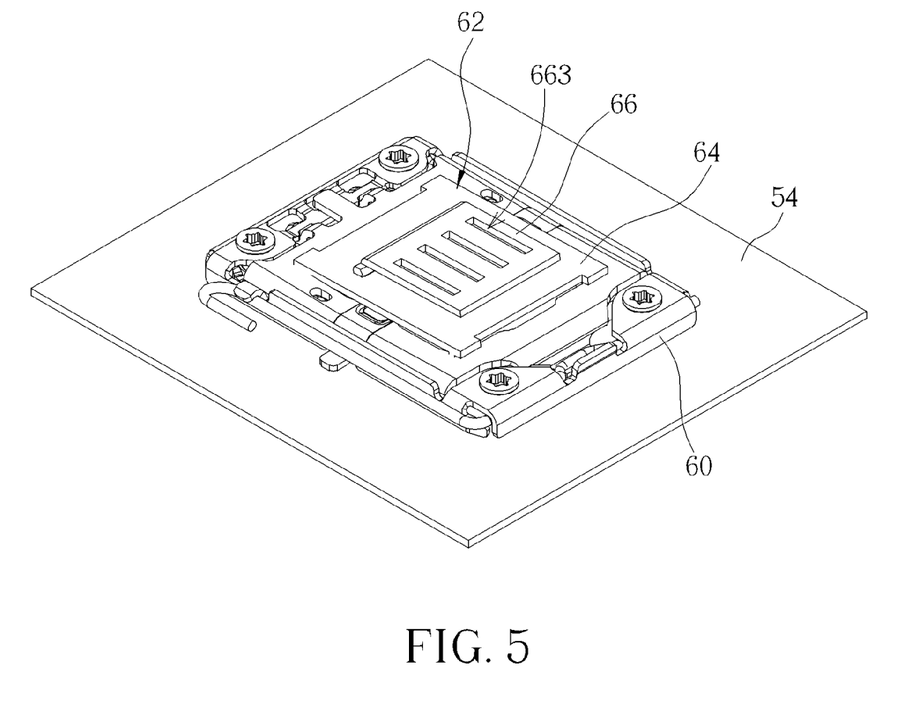

Please refer to FIG. 2 to FIG. 5. FIG. 2 is a partial exploded diagram of the electronic device 50 (as shown in FIG. 1) illustrated in FIG. 1 according to the embodiment of the present invention. FIG. 3 is a diagram of the protective cover mechanism 62 according to the embodiment of the present invention. FIG. 4 and FIG. 5 are assembly diagrams of the socket 58 covered with the protective cover mechanism 62 in different states according to the embodiment of the present invention. The protective cover mechanism 62 is for protecting the socket 58 of the electronic device 50. Because motherboards are often stacked in a delivery vehicle as being transported, so that the socket, like a CPU socket, is damaged easily because of collision between the motherboards without any protective mechanism. As a result, the protective cover mechanism 62 is disposed on the CPU socket for preventing the CPU socket from being damaged due to the collision in transportation. The protective cover mechanism 62 includes a base 64 and a fluid restrictor 66. The base 64 is disposed on the socket 58 for covering the socket 58. The fluid restrictor 66 is installed on the base 64 for blocking airflow on a side of the socket 58, so as to guide the airflow to a neighboring electronic component 56.

As shown in FIG. 3, the fluid restrictor 66 can be pivoted to the base 64. For example, the fluid restrictor 66 includes a protruding column 661, and an engaging slot 641 is formed on the base 64 for engaging with the protruding column 641, so that the fluid restrictor 66 is pivoted to the base 64. That is, the fluid restrictor 66 can pivot relative to the base 64 via the protruding column 661. The protruding column 661 can be made of resilient material, and the protruding column 661 can be separated from the engaging slot 641 as being pressed inward, so as to separate the fluid restrictor 66 from the base 64. That is, the fluid restrictor 66 is installed on the base 64 in a detachable manner. As the fluid restrictor 66 is damaged and needs to be replaced, it is only to replace the damaged fluid restrictor 66 by a new fluid restrictor 66 instead of discarding the whole protective cover mechanism 62. The base 64 further includes at least one resilient fixing arm 643 for engaging with the socket 58, and the at least one resilient fixing arm 643 and the base 64 can be integrally formed. In this embodiment, the base 64 includes the four resilient fixing arms 643. In addition, a plurality of holes 663 is formed on the fluid restrictor 66 for controlling a flow rate of the airflow passing through the fluid restrictor 66. In this embodiment, the four holes 663 are formed on the fluid restrictor 66. An amount and positions of the holes 663 are not limited to this embodiment, and it depends on practical design demand.

Figure 6:
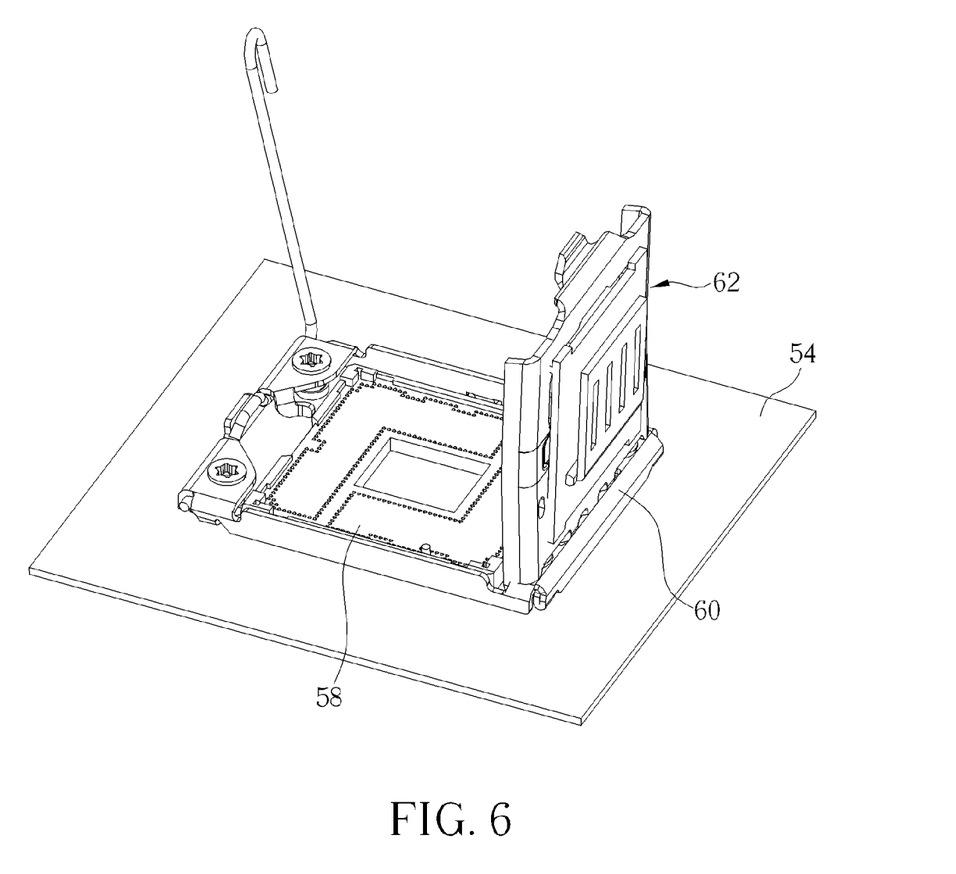
FIG. 6 is a diagram illustrating that the socket has not been covered with the protective cover mechanism according to the embodiment of the present invention.

Please refer to FIG. 2 to FIG. 6. FIG. 6 is a diagram illustrating that the socket 58 has not been covered with the protective cover mechanism 62 according to the embodiment of the present invention. As shown in FIG. 2, the socket 58 is installed on the circuit board 54 first, and then the independent loading mechanism 60 is installed on the circuit board 54. At this time, the independent loading mechanism 60 surrounds the socket 58. In this embodiment, a side of the independent loading mechanism 60 is fixed on the circuit board 54 by screws, but a method for fixing the independent loading mechanism 60 on the circuit board 54 is not limited to it. After that, the protective cover mechanism 62 is installed on the independent loading mechanism 60. In this embodiment, the four resilient fixing arms 643 of the protective cover mechanism 62 are for engaging with the independent loading mechanism 60, so that the protective cover mechanism 62 is installed on the independent loading mechanism 60 stably. Because the four resilient fixing arms 643 are made of the resilient material, the base 64 can be detachably installed on the independent loading mechanism 60. That is, as it is desired to install the CPU chipset on the socket 58, as shown in FIG. 6, it only needs to pivot the independent loading mechanism 60 relative to the circuit board 54 to expose the socket 58. Then, the protective cover mechanism 62 is detached from the independent loading mechanism 60, and the independent loading mechanism 60 pivots to cover the CPU chipset and the socket 58.

Figure 7:
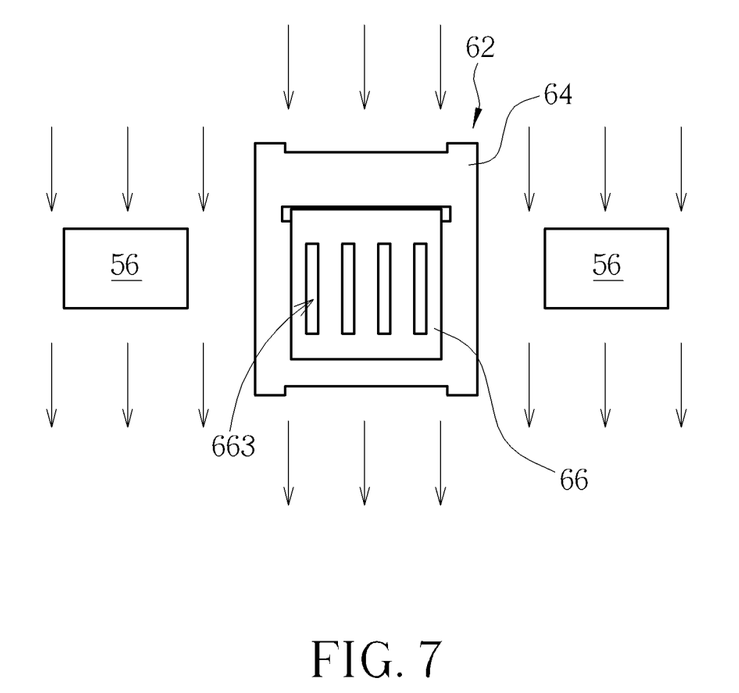
FIG. 7 is a top view of a fluid restrictor parallel to a base according to the embodiment of the present invention.
Figure 8:
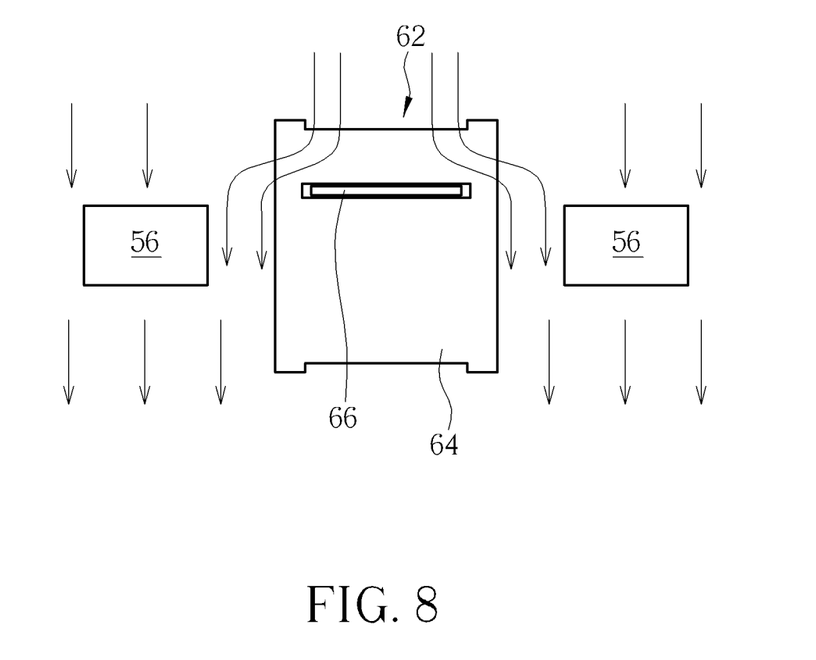
FIG. 8 is a top view of the fluid restrictor perpendicular to the base according to the embodiment of the present invention.

Please refer to FIG. 4, FIG. 5 and FIG. 7 to FIG. 8. FIG. 7 is a top view of the fluid restrictor 66 parallel to the base 64 according to the embodiment of the present invention. FIG. 8 is a top view of the fluid restrictor 66 perpendicular to the base 64 according to the embodiment of the present invention. The fluid restrictor 66 can pivot relative to the base 64, so that the fluid restrictor 66 can be rotated to control the flow rate of the airflow passing by the socket 58. As shown in FIG. 7, the fluid restrictor 66 does not block the airflow on the side of the socket 58 as the fluid restrictor 66 pivots to a position where the fluid restrictor 66 is substantially parallel to the base 64. That is, as the fluid restrictor 66 is substantially parallel to the base 64, the airflow passing by the socket 58 is not blocked by the fluid restrictor 66 and passes over the socket 58 and the protective cover mechanism 62. As a result, the airflow passes by the socket 58 cannot be guided to the electronic component 56 disposed near the socket 58 to dissipate heat generated by the electronic component 56.

Figure 9:
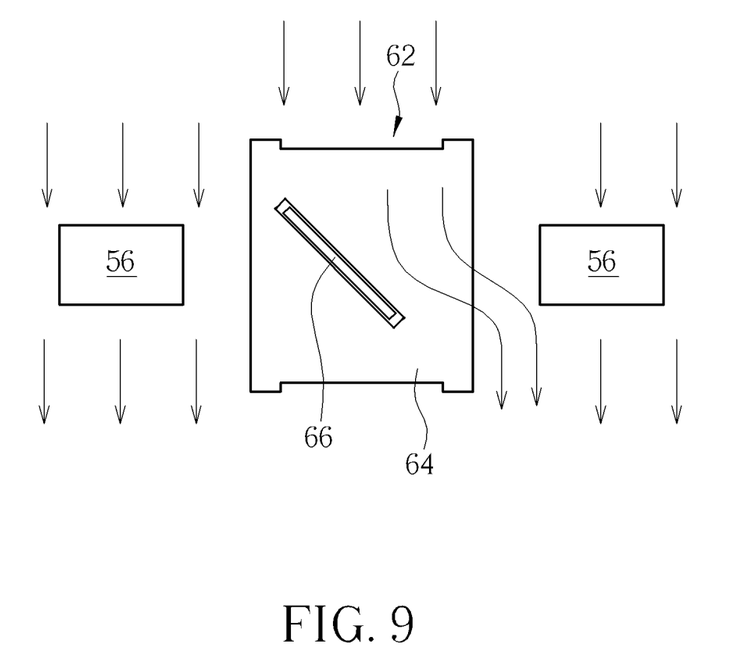
FIG. 9 is a diagram illustrating that the fluid restrictor is disposed on the base obliquely according to the embodiment of the present invention.

As shown in FIG. 8, as the fluid restrictor 66 is perpendicular to the base 64, the airflow passing by the socket 58 is blocked by the fluid restrictor 66 and is guided to the electronic component 56 near the socket 58, so as to dissipate the heat generated by the electronic component 56. In addition, it can dispose less holes 663 on the fluid restrictor 66 to block most of the airflow, or it can dispose more holes 663 to block fewer airflow, as the fluid restrictor 66 is perpendicular to the base 64. An amount of the holes 663 is not limited to this embodiment, and it depends on practical design demand. Furthermore, please refer to FIG. 9. FIG. 9 is a diagram illustrating that the fluid restrictor 66 is disposed on the base 64 obliquely according to the embodiment of the present invention. The fluid restrictor 66 of the present invention also cannot be parallel to the socket 58. That is, the fluid restrictor 66 can be disposed on the base 64 obliquely, so as to adjust the airflow passing by the socket 58 and to guide the airflow to the neighbor electronic component 56. An oblique orientation of the fluid restrictor 66 relative to the socket 58 depends on practical design demands.

In conclusion, it can ensure that there is enough airflow to pass by the neighbor electronic component 56 by a design of the fluid restrictor 66 as there is no chipset and heat sink which have not been installed on the socket 58. That is, there is no need to install an external heat sink on the socket 58 to avoid the small flow resistance, which leads to the unexpected flow field and results in low efficiency of cooling the electronic component 56.

Figure 10:
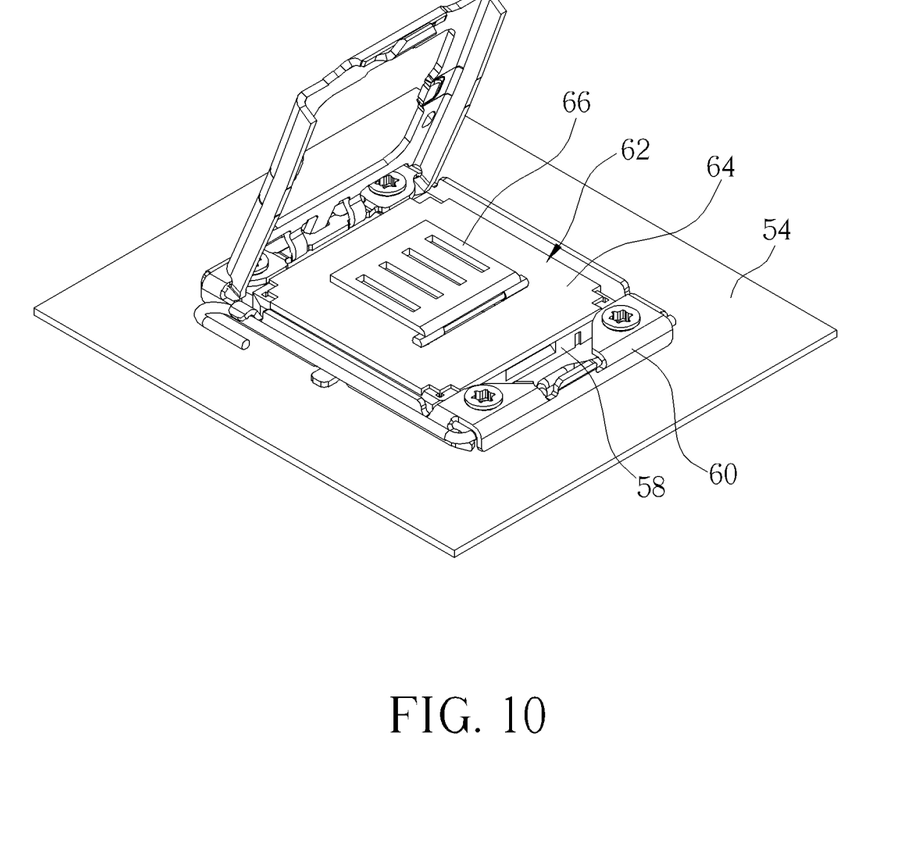
FIG. 10 is a diagram of the protective cover mechanism disposed on the socket according to another embodiment of the present invention.

Please refer to FIG. 10. FIG. 10 is a diagram of the protective cover mechanism 62 disposed on the socket 58 according to another embodiment of the present invention. In this embodiment, the base 64 is installed on the socket 58 in the detachable manner. That is, the base 64 can be designed to fit the socket 58, so that the base 64 can be directly installed on the socket 58 without using the independent loading mechanism 60 shown in FIG. 4, so as to provide the socket 58 with better protection.

In contrast to the prior art, the protective cover mechanism 62 of the present invention is engaged with the base 64 or the independent loading mechanism 60 by the resilient fixing arm 643 of the base 64, and the protective cover mechanism 62 is for prevent the socket 58 from being damaged due to the collision. The fluid restrictor 66 is further disposed on the base 64 of the protective cover mechanism 60, so as to guide the airflow passing by the socket to the neighbor electronic component by pivoting the fluid restrictor 66 relative to the base 64, to dissipate the heat generated by the neighbor electronic component. Therefore, it can solve the problem of the socket 58 being damaged due to the collision between the motherboards, and further provides an effect of guiding the airflow passing by the socket 58 to the neighbor electronic component to dissipate the heat generated by the neighbor electronic component.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protective cover mechanism, comprising:
    a base disposed on a socket for covering the socket; and
    a fluid restrictor installed on and pivoted to the base for blocking airflow on a side of the socket, so as to guide the airflow to a neighboring electronic component, and the fluid restrictor not blocking the airflow on the side of the socket as the fluid restrictor pivots to a position where the fluid restrictor is substantially parallel to the base.

2. The protective cover mechanism of claim 1, wherein the fluid restrictor comprises a protruding column, and an engaging slot is formed on the base for engaging with the protruding column, so that the fluid restrictor is pivoted to the base.

3. The protective cover mechanism of claim 2, wherein the protruding column is made of resilient material, and the protruding column is separated from the engaging slot as being pressed inward, so as to separate the fluid restrictor from the base.

4. The protective cover mechanism of claim 1, wherein a plurality of holes is formed on the fluid restrictor for controlling a flow rate of the airflow passing through the fluid restrictor.

5. The protective cover mechanism of claim 1, wherein the base is installed on the socket or on an independent loading mechanism in a detachable manner.

6. The protective cover mechanism of claim 1, wherein the base comprises at least one resilient fixing arm for engaging with the socket.

7. The protective cover mechanism of claim 6, wherein the at least one resilient fixing arm and the base are integrally formed.

8. The protective cover mechanism of claim 1, wherein the base comprises at least one resilient fixing arm for engaging with an independent loading mechanism.

9. The protective cover mechanism of claim 8, wherein the at least one resilient fixing arm and the base are integrally formed.

10. An electronic device, comprising:
    a casing;
    a circuit board disposed inside the casing;
    an electronic component installed on the circuit board;
    a socket installed on the circuit board;
    an independent loading mechanism pivoted to the circuit board for engaging a chipset with the socket; and
    a protective cover mechanism for protecting the socket of the electronic device,
        the protective cover mechanism comprising:
        a base disposed on the socket for covering the socket; and
        a fluid restrictor installed on and pivoted to the base for blocking airflow on a side of the socket, so as to guide the airflow to a neighboring electronic component, and the fluid restrictor not blocking the airflow on the side of the socket as the fluid restrictor pivots to a position where the fluid restrictor is substantially parallel to the base.

11. The electronic device of claim 10, wherein the fluid restrictor comprises a protruding column, and an engaging slot is formed on the base for engaging with the protruding column, so that the fluid restrictor is pivoted to the base.

12. The electronic device of claim 11, wherein the protruding column is made of resilient material, and the protruding column is separated from the engaging slot as being pressed inward, so as to separate the fluid restrictor the base.

13. The electronic device of claim 10, wherein a plurality of holes is formed on the fluid restrictor for controlling a flow rate of the airflow passing through the fluid restrictor.

14. The electronic device of claim 10, wherein the base is installed on the socket or on an independent loading mechanism in a detachable manner.

15. The electronic device of claim 10, wherein the base comprises at least one resilient fixing arm for engaging with the socket.

16. The electronic device of claim 15, wherein the at least one resilient fixing arm and the base are integrally formed.

17. The electronic device of claim 10, wherein the base comprises at least one resilient fixing arm for engaging with an independent loading mechanism.

18. The electronic device of claim 17, wherein the at least one resilient fixing arm and the base are integrally formed.

* * * * *